United States Patent [19]

Scammell

[11] Patent Number: 5,158,820

[45] Date of Patent: Oct. 27, 1992

[54] SIGNAL CARRIER SUPPORTS WITH APERTURED DIELECTRIC LAYER

[75] Inventor: Antony J. Scammell, Chelmsford, United Kingdom

[73] Assignee: The Marconi Company Limited, Middlesex, United Kingdom

[21] Appl. No.: 530,841

[22] Filed: May 31, 1990

[30] Foreign Application Priority Data

Jun. 5, 1989 [GB] United Kingdom ............... 8912806

[51] Int. Cl.$^5$ ........................... H01P 3/08; B32B 3/24
[52] U.S. Cl. .................... 428/138; 428/131; 428/137; 428/304.4; 428/411.1; 428/457; 428/901; 333/238; 333/246; 333/204; 174/117 FF; 343/700 MS
[58] Field of Search ............ 428/131, 137, 138, 304.4, 428/411.1, 457, 901; 333/238, 246, 204; 174/117 FF; 343/700 MS

[56] References Cited

U.S. PATENT DOCUMENTS

| | | | |
|---|---|---|---|
| 2,721,312 | 10/1955 | Grieg et al. | 333/238 |
| 2,877,427 | 3/1959 | Butler | 333/128 |
| 2,919,441 | 12/1959 | Chu | 343/810 |
| 3,004,229 | 10/1961 | Stearns | 333/128 |
| 3,065,435 | 11/1962 | Jones | 333/238 |
| 4,423,282 | 12/1983 | Suzuki et al. | 174/36 |
| 4,460,897 | 7/1984 | Gans | 333/238 |
| 4,513,266 | 4/1985 | Ishihara | 333/238 |
| 4,559,254 | 12/1985 | Suzuki | 428/131 |
| 4,646,436 | 3/1987 | Crowell | 29/850 |

FOREIGN PATENT DOCUMENTS

| | | |
|---|---|---|
| 0061309 | 9/1982 | European Pat. Off. . |
| 0204446 | 12/1986 | European Pat. Off. . |
| 643161 | 3/1937 | Fed. Rep. of Germany . |
| 1148290 | 5/1963 | Fed. Rep. of Germany ...... 333/238 |
| 2041484 | 2/1972 | Fed. Rep. of Germany . |
| 2444228 | 3/1976 | Fed. Rep. of Germany ...... 333/238 |
| 0269401 | 11/1987 | Japan .................................. 333/238 |
| 1128010 | 9/1968 | United Kingdom . |
| 2075744 | 11/1981 | United Kingdom . |

Primary Examiner—Ellis P. Robinson
Assistant Examiner—William P. Watkins, III
Attorney, Agent, or Firm—Spencer, Frank & Schneider

[57] ABSTRACT

A signal carrying structure comprising a planar conductive member having a major surface, a dielectric layer having a substantially constant thickness, and a conductive track. A first major surface of the dielectric layer is in contact with the major surface of the planar conductive member, and the conductive track is in contact with a second major surface of the dielectric layer. The conductive track is spaced from the major surface of the planar conductive member by the dielectric layer. The dielectric layer has a plurality of apertures which extend between the first and second major surfaces thereof in the region between the conductive track and the planar conductive member. The proportion of dielectric material in the dielectric layer is less in this region than in the other regions of the dielectric layer. The structure is used for propagating microwave electromagnetic radiation, and is applicable to strip line, triplate and phased array antenna applications.

6 Claims, 2 Drawing Sheets 5,158,820

SIGNAL CARRIER SUPPORTS WITH APERTURED DIELECTRIC LAYER

BACKGROUND OF THE INVENTION

This invention relates to supports for signal carriers, and particularly to supports for triplate centre conductors.

A typical known triplate is shown in FIG. 1. It comprises a pair of parallel conductive ground planes 1 and 2 and a central conductor 3 between and parallel to them.

The central conductor 3 is held in position by being sandwiched between two dielectric sheets 4 and 5. The sheets 4 and 5 are secured to the ground planes 1 and 2 and are equal in thickness to ensure that the central conductor 3 is held equidistant from the two ground planes 1 and 2.

Another way of supporting the centre conductor is shown in FIG. 2. A triplate conductive ground plane 6 supports a plurality of dielectric strips 7 all of equal thickness. The strips 7 in turn support a centre conductor 8, because the dielectric strips 7 are all of equal thickness the centre conductor 8 is held parallel to the ground plane 6. A second plurality of dielectric strips secured to a second ground plane would be placed on top of the centre conductor 8 to hold the centre conductor 8 equidistant between the two ground planes. This is not shown, for clarity.

There are disadvantages to both of these constructions. The use of continuous sheets of dielectric material results in the triplate structure being a lossy transmission line, while the use of separate dielectric strips is expensive because placing and securing the large numbers of individual dielectric strips required is very time consuming.

This invention was intended to at least partially overcome these problems.

BRIEF SUMMARY OF THE INVENTION

This invention provides a signal carrying structure including a first conductive member and a second conductive member separated by a dielectric layer having a substantially constant thickness and having a plurality of closed apertures therein, between the first and second conductive members.

This gives a structure that can be quickly assembled because the dielectric material separating the conductors is in one piece and forms a low loss signal path because at least some of the dielectric lying directly between the conductors has been replaced by air.

BRIEF DESCRIPTION OF THE DRAWINGS

A signal carrier employing the invention will now be described with reference to the accompanying figures in which.

DETAILED DESCRIPTION OF THE DRAWINGS

Figure 1:
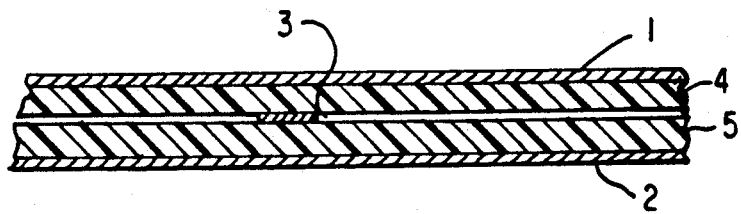
FIGS. 1 and 2 depict examples of the prior art.
Figure 2:
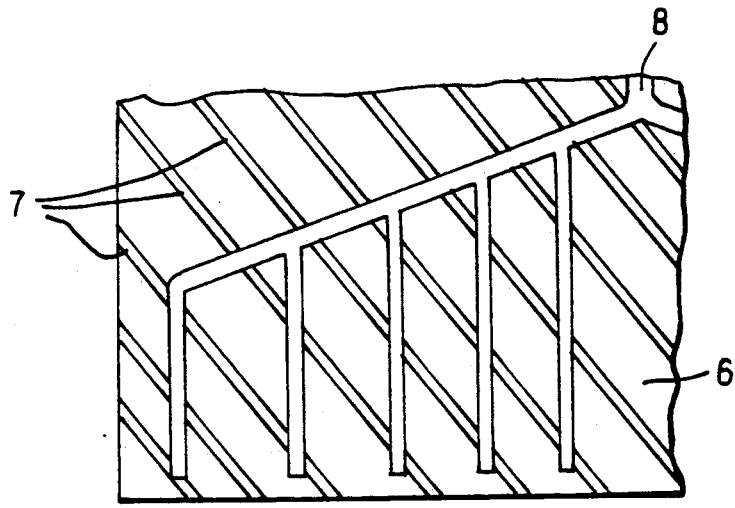
Figure 3:
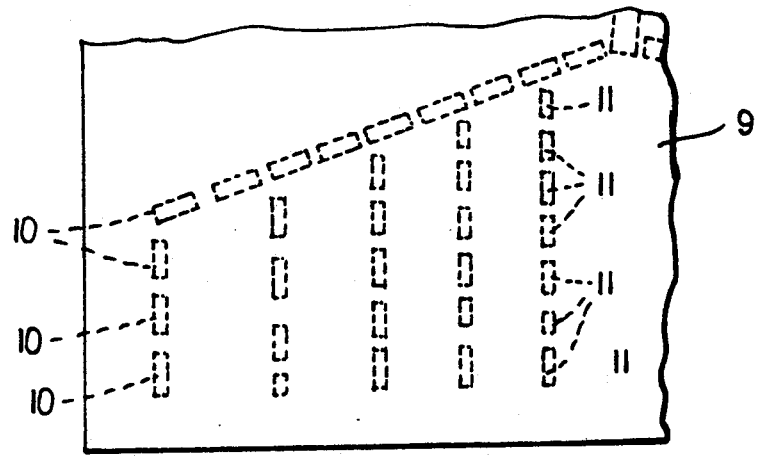
FIG. 3 shows in schematic form a first stage in the production of a triplate according to one embodiment of the invention.

Referring to FIG. 3 a sheet 9 of dielectric foam material having constant thickness has a plurality of closed apertures 10 cut in it by a laser following the dashed lines 11. By a closed aperture is meant an aperture entirely bounded by the material of the sheet 9.

Figure 4:
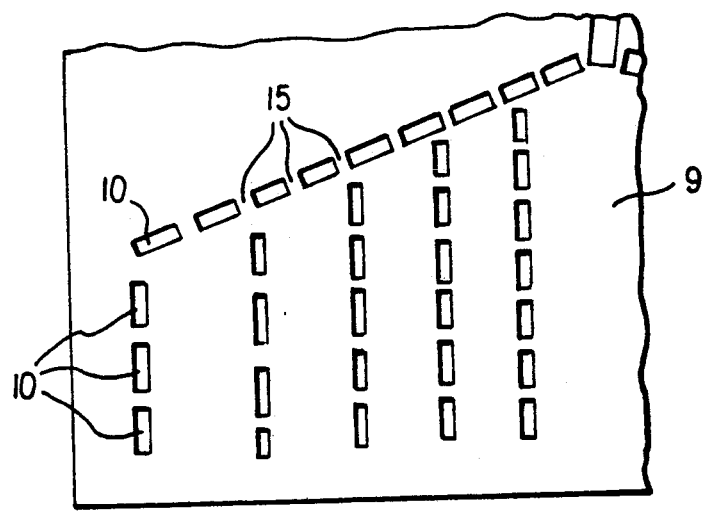
FIG. 4 shows a second stage in the production of the same triplate as FIG. 3 in schematic form.

This results in the structure shown in FIG. 4.

Figure 5:
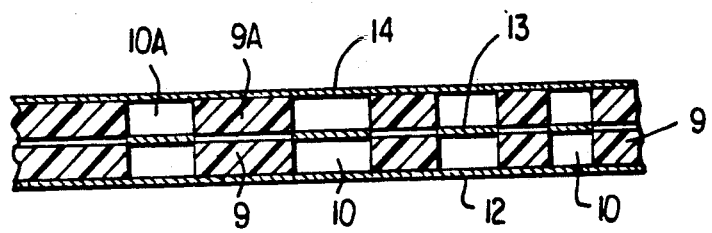
FIG. 5 shows a cross section through a completed triplate in schematic form.
Figure 6:
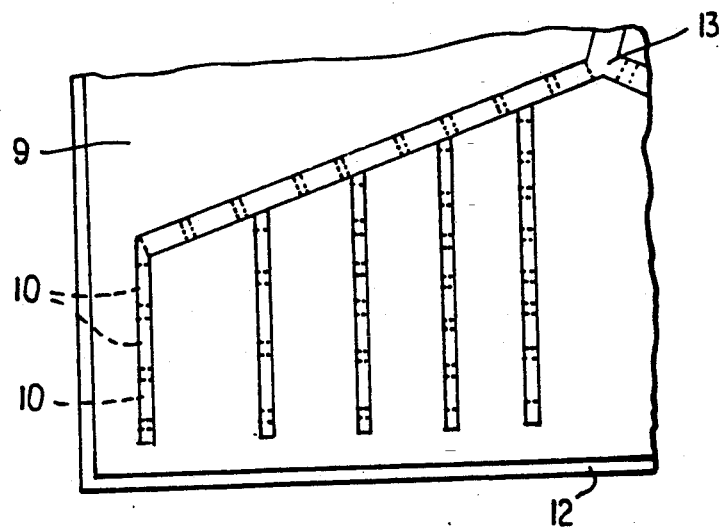
FIG. 6 shows a cut-away view of the triplate of FIG. 5 in schematic form; identical parts having the same reference numerals throughout.

The dielectric sheet or layer 9 is then placed between a triplate ground plane or planar conductive member 12 and a triplate central conductor or conductive track 13. A second identical dielectric sheet 9A having closed apertures 10A is then placed on the opposite side of the triplate centre conductor 13, separating it from a second triplate ground plane 14. This is shown in cross section in FIG. 5 and with the second dielectric sheet 9A and second triplate ground plane 14 cut away in FIG. 6.

The apertures 10 and 10A in the dielectric sheets 9 and 9A respectively are arranged so that they are the same width and lie along the triplate centre conductor 13. The central conductor 13 is supported by the small sections 15 of dielectric separating the apertures 10. Thus, the proportion of dielectric material in the dielectric layers 9 and 9A is less in the region between the conductive track 13 and the ground planes 12 and 14 respectively than in other regions of the dielectric layer.

Thus the centre conductor 13 is supported and is held parallel to and equidistant from the outer conductors 12 and 14 by the dielectric sheets 9 and 9A. The triplate structure thus formed can typically constitute part of a phased array antenna for propagating microwave electromagnetic radiation.

The same structure could be used in a stripline for propagating microwave electromagnetic radiation by employing only a signal carrier separated from one ground plane by a single dielectric sheet of the type described above.

The apertures 10 and 10A could be formed by methods other than laser cutting such as stamping.

What we claim is:

1. A signal carrying structure comprising:

a planar conductive member having a major surface;

a dielectric layer composed of dielectric material having a substantially constant thickness, first and second major surfaces and a plurality of apertures therein, the first major surface of said dielectric layer being in contact with the major surface of said planar conductive member; and a conductive track in contact with the second major surface of said dielectric layer, said conductive track being spaced from the major surface of said planar conductive member by said dielectric layer, each of the apertures in said dielectric layer extending between the first and second major surfaces thereof in the region between said conductive track and said planar conductive member, the proportion of dielectric material in the dielectric layer being less in said region than in other regions of said dielectric layer.

2. A structure as claimed in claim 1 wherein said structure is a stripline in which said planar conductive member acts as a ground plane.

3. A structure as claimed in claim 1 which further comprises a second planar conductive member separated from the conductive track by a second dielectric layer of the same thickness as the first dielectric layer and having first and second major surfaces, said second dielectric layer having a plurality of apertures each extending between the first and second major surfaces of said second dielectric layer in the region between said conductive track and the second planar conductive member, the first and second planar conductive members being ground planes and the conductive track being a triplate central conductor.

4. A structure as claimed in claim 1 wherein said apertures are formed in the dielectric layer by laser cutting.

5. A phased array antenna comprising a signal carrying structure as claimed in claim 3.

6. A signal carrying structure comprising:
first and second planar conductive members, each of said members having a major surface;
first and second dielectric layers interposed between said first and second planar conductive members, each of said dielectric layers having first and second major surfaces and being of the same substantially constant thickness, the first major surfaces of said first and second dielectric layers being in contact with the major surfaces of said first and second planar conductive members respectively; and
a conductive track interposed between and in contact with the second major surfaces of said first and second dielectric layers, each of said dielectric layers having a plurality of apertures therein which extend between the first and second major surfaces thereof only in the regions between said conductive track and said first and second planar conductive members.

* * * * *